United States Patent
Moon et al.

(10) Patent No.: US 10,490,509 B2
(45) Date of Patent: Nov. 26, 2019

(54) SUBSTRATE HAVING POWER DELIVERY NETWORK FOR REDUCING ELECTROMAGNETIC INTERFERENCE AND DEVICES INCLUDING THE SUBSTRATE

(71) Applicant: Samsung Electronics Co., Ltd., Suwon-si (KR)

(72) Inventors: Sung Wook Moon, Yongin-si (KR); Min Sung Kim, Incheon (KR); Eun Seok Song, Hwaseong-si (KR); Kyoung Ho Kim, Hwaseong-si (KR); Dong Chul Kim, Yongin-si (KR); Jin Ho Kim, Suwon-si (KR); Ji Hyun Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 191 days.

(21) Appl. No.: 15/363,257

(22) Filed: Nov. 29, 2016

(65) Prior Publication Data

US 2017/0263567 A1 Sep. 14, 2017

(30) Foreign Application Priority Data

Mar. 11, 2016 (KR) ........................ 10-2016-0029474

(51) Int. Cl.
*H01L 23/552* (2006.01)
*G09G 3/20* (2006.01)
(Continued)

(52) U.S. Cl.
CPC ......... *H01L 23/552* (2013.01); *G09G 3/2092* (2013.01); *H01L 23/4985* (2013.01); *H01L 23/49822* (2013.01); *H01L 23/49838* (2013.01); *H01L 23/585* (2013.01); *G09G 2300/043* (2013.01); *G09G 2310/0264* (2013.01); *G09G 2330/021* (2013.01); *G09G 2330/028* (2013.01); *G09G 2330/06* (2013.01); *H01L 24/17* (2013.01); *H01L 2224/16227* (2013.01); *H01L 2924/1426* (2013.01); *H01L 2924/3025* (2013.01)

(58) Field of Classification Search
CPC ............ H01L 23/552; H01L 23/49822; H01L 23/49838; H01L 23/4985; H01L 23/585; G09G 3/2092; G09G 2300/043
See application file for complete search history.

(56) References Cited

U.S. PATENT DOCUMENTS 3,614,546 A * 10/1971 Avins .................... H01L 23/057
257/664
3,781,596 A * 12/1973 Galli ................. H01L 23/49524
174/254

(Continued)

*Primary Examiner* — Sejoon Ahn
(74) *Attorney, Agent, or Firm* — Onello & Mello, LLP

(57) ABSTRACT

A semiconductor package includes an integrated circuit mounted on a substrate, a first power line disposed on or above the substrate and configured to transmit an operating voltage to the integrated circuit, and a second power line disposed on or above the substrate and configured to transmit a ground voltage to the integrated circuit, in which each of the first power line and the second power line has a first width, the first power line is spaced apart from the second power line by a first distance, thicknesses of each of the first power line and the second power line are less than or equal to 20 μm, and a ratio of the first width to the first distance is greater than 2.5.

17 Claims, 9 Drawing Sheets

(51) Int. Cl.
*H01L 23/498* (2006.01)
*H01L 23/58* (2006.01)
*H01L 23/00* (2006.01)

(56) References Cited

U.S. PATENT DOCUMENTS

| | | | |
|---|---|---|---|
| 4,320,438 A * | 3/1982 | Ibrahim | H01L 23/057 |
| | | | 174/535 |
| 4,628,343 A | 12/1986 | Komatsu | |
| 5,165,166 A * | 11/1992 | Carey | H01L 23/4985 |
| | | | 174/261 |
| 5,670,815 A | 9/1997 | Childs et al. | |
| 5,966,294 A | 10/1999 | Harada et al. | |
| 6,399,903 B1 | 6/2002 | Stevenson | |
| 6,573,711 B1 | 6/2003 | Schaenzer et al. | |
| 7,278,124 B2 | 10/2007 | Shimazaki et al. | |
| 7,363,607 B2 | 4/2008 | Birch et al. | |
| 8,106,425 B2 | 1/2012 | Choi et al. | |
| 9,619,083 B1 * | 4/2017 | Kang | G06F 3/0412 |
| 2001/0030061 A1 * | 10/2001 | Yoneda | H01L 23/49822 |
| | | | 174/260 |
| 2002/0109814 A1 | 8/2002 | Murahashi et al. | |
| 2004/0061694 A1 * | 4/2004 | Noguchi | G09G 3/3233 |
| | | | 345/204 |
| 2006/0022925 A1 * | 2/2006 | Hara | G09G 3/3688 |
| | | | 345/89 |
| 2006/0076158 A1 | 4/2006 | Umeyama et al. | |
| 2006/0108694 A1 | 5/2006 | Hung et al. | |
| 2007/0001711 A1 * | 1/2007 | Kwak | G09G 3/006 |
| | | | 324/762.07 |
| 2007/0012774 A1 | 1/2007 | Cho et al. | |
| 2007/0075940 A1 * | 4/2007 | Nakamura | G09G 3/325 |
| | | | 345/77 |
| 2007/0096154 A1 * | 5/2007 | Shimbo | H01L 27/0207 |
| | | | 257/207 |
| 2007/0120485 A1 * | 5/2007 | Kim | H01J 11/12 |
| | | | 313/582 |
| 2008/0079026 A1 * | 4/2008 | Tomotani | H01L 27/0207 |
| | | | 257/207 |
| 2010/0315400 A1 * | 12/2010 | Choi | G02F 1/13452 |
| | | | 345/211 |
| 2011/0266565 A1 * | 11/2011 | Wang | G02F 1/1339 |
| | | | 257/91 |
| 2012/0056904 A1 * | 3/2012 | Lhee | G09G 3/3233 |
| | | | 345/690 |
| 2014/0042515 A1 * | 2/2014 | Tseng | H01L 29/402 |
| | | | 257/315 |

* cited by examiner

SUBSTRATE HAVING POWER DELIVERY NETWORK FOR REDUCING ELECTROMAGNETIC INTERFERENCE AND DEVICES INCLUDING THE SUBSTRATE

CROSS-REFERENCE TO RELATED APPLICATION

This application claims priority under 35 U.S.C. § 119 from Korean Patent Application No. 10-2016-0029474 filed on Mar. 11, 2016 the disclosure of which is hereby incorporated by reference in its entirety.

BACKGROUND

Example embodiments of the present inventive concepts relate to a power delivery network for reducing electromagnetic interference (EMI). More particularly, example embodiments of the present inventive concepts relate to a substrate including a power delivery network and having a structure to reduce EMI and devices including the substrate.

An electromagnetic interference (EMI) refers to electromagnetic waves generated in an electronic device that affect other electronic devices. The other electronic devices may malfunction due to the electromagnetic waves generated in the electronic device. An EMI noise is determined by an intensity of a noise source and an amount of radiation of electromagnetic waves generated from a pattern of power lines, for example, operating voltage lines for supplying an operating voltage and ground lines for supplying a ground voltage, disposed on a printed circuit board (PCB). That is, the power lines disposed on or above the PCB may operate as a noise source generating noises. EMI is generated in accordance with the noises.

SUMMARY

In one aspect, the present inventive concepts are directed to a display device including a display panel configured to display an image, a drive circuit configured to drive the display panel, and a semiconductor package connected between the display panel and the drive circuit. The semiconductor package includes a substrate, an integrated circuit on the substrate, a first power line on or above the substrate and configured to transmit an operating voltage to the integrated circuit, and a second power line on or above the substrate and configured to transmit a ground voltage to the integrated circuit. Each of the first power line and the second power line has a first width, the first power line is spaced apart from the second power line by a first distance, thicknesses of each of the first power line and the second power line are less than or equal to 20 μm, and a ratio of the first width to the first distance is greater than 2.5.

In another aspect, the present inventive concepts are directed to a semiconductor package including a substrate, an integrated circuit on the substrate, a first power line on or above the substrate and configured to transmit an operating voltage to the integrated circuit, and a second power line on or above the substrate and configured to transmit a ground voltage to the integrated circuit. Each of the first power line and the second power line has a first width, the first power line is spaced apart from the second power line by a first distance, thicknesses of each of the first power line and the second power line are less than or equal to 20 μm, and a ratio of the first width to the first distance is greater than 2.5.

In another aspect, the present inventive concepts are directed to a substrate used in a semiconductor package including a display driver IC including a first power line on or above the substrate and configured to transmit an operating voltage to the display driver IC and a second power line on or above the substrate and configured to transmit a ground voltage to the display driver IC. Each of the first power line and the second power line has a first width, the first power line is spaced apart from the second power line by a first distance, thicknesses of each of the first power line and the second power line are less than or equal to 20 μm, and a ratio of the first width to the first distance is greater than 2.5. The substrate is a base film, when the semiconductor package is a chip-on-film package. The substrate is a glass substrate, when the semiconductor package is a chip-on-glass package. The substrate is a flexible printed circuit board, when the semiconductor package is a chip-on-flex package.

In another aspect, the present inventive concepts are directed to a semiconductor package including a first power line on or above a substrate and configured to transmit an operating voltage, and a second power line on or above the substrate in parallel with the first power line and configured to transmit a ground voltage. Each of the first power line and the second power line has a first width. The first power line is spaced apart from the second power line by a first distance. Thicknesses of each of the first power line and second power line are less than or equal to 20 μm. A ratio of the first width to the first distance is greater than 2.5.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which.

DETAILED DESCRIPTION OF THE EMBODIMENTS

Figure 1A:
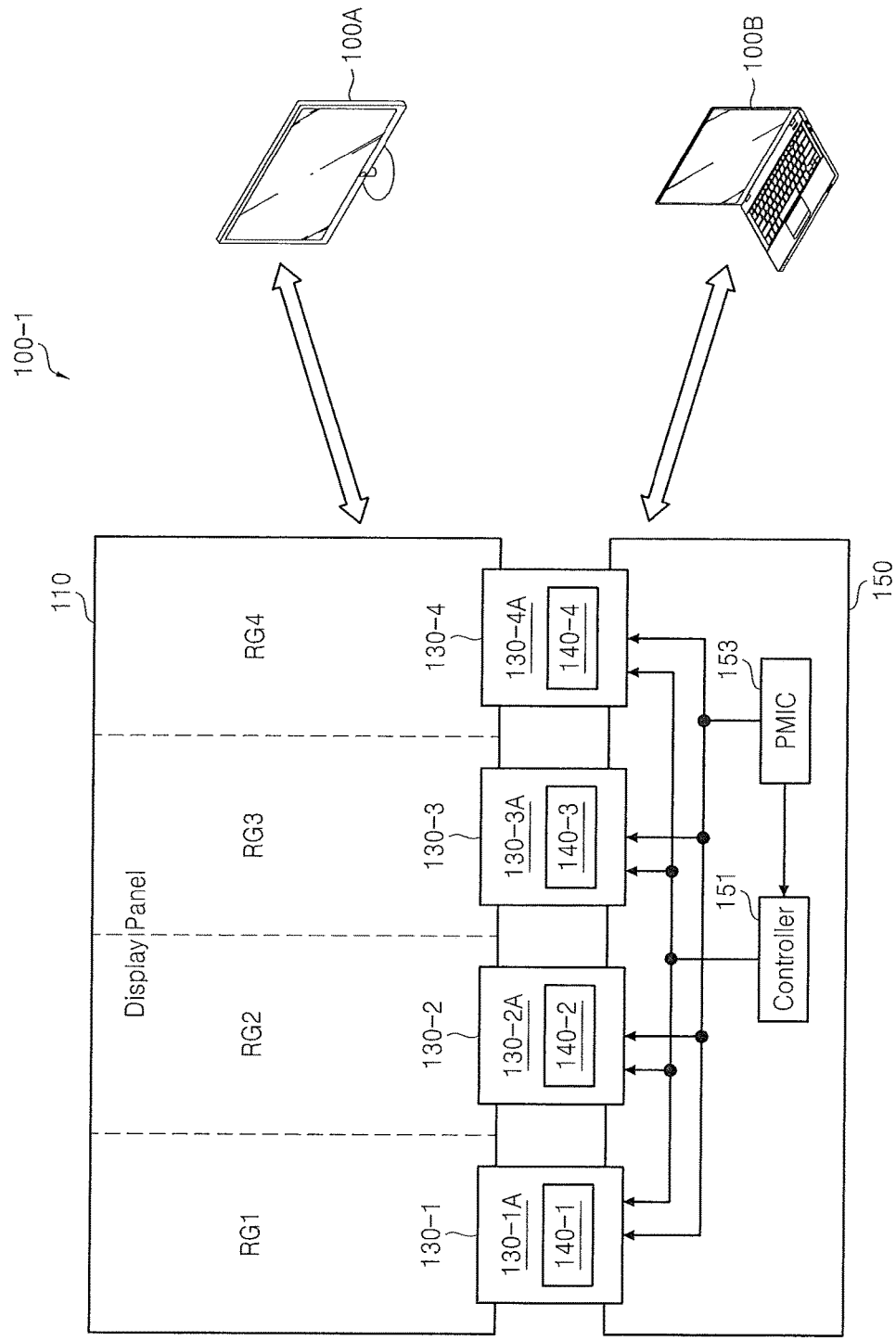
FIG. 1A is a block diagram illustrating a data processing system including semiconductor packages according to some embodiments of the present inventive concepts.

Reference will now be made in detail to the embodiments of the present general inventive concepts, examples of which are illustrated in the accompanying drawings, wherein like reference numerals refer to the like elements throughout. The embodiments are described below in order to explain the present general inventive concepts by referring to the figures.

FIG. 1A is a block diagram illustrating a data processing system including semiconductor packages according to some embodiments of the present inventive concepts. Referring to FIG. 1A, a data processing system 100-1 may include a display panel 110, a plurality of semiconductor packages 130-1 to 130-4, and a drive circuit 150.

The data processing system 100-1 may include, for example, a TV (or TV system) 100A, a laptop computer 100B, or a desktop computer; however, the present inventive concepts are not limited thereto. The display panel 110 may include, for example, a flat display displaying an image.

Accordingly, the data processing system 100-1 may be a display device including the flat display 110. The flat display 110 may include, for example, a thin film transistor-liquid crystal display (TFT-LCD), a light emitting diode (LED) display, an organic LED (OLED) display, an active-matrix OLED (AMOLED), a flexible display, or the like.

The drive circuit 150 may generate image data corresponding to an image to be displayed on the display panel 110 and may generate control signals necessary for transmission of the image data. The drive circuit 150 may collectively be, for example, a printed circuit board (PCB), an integrated circuit IC, a system on chip (SoC), an application processor, a mobile application processor, a chipset, a set of chips, or the like.

The drive circuit 150 may include a controller 151 and a power management IC (PMIC) 153. The controller 151 may include, for example, a CPU, a processor, or a timing controller. The controller 151 may generate image data corresponding to an image to be displayed on the display panel 110 and may generate control signals necessary for transmission of the image data generated by the controller 151. The PMIC 153 may transmit, or supply, an operating voltage and a ground voltage to the controller 151 and each of the plurality of semiconductor packages 130-1 to 130-4, respectively. The operating voltage is represented as "VDD" and the ground voltage is represented as "VSS".

Each of the plurality of semiconductor packages 130-1 to 130-4 may be electrically connected between the display panel 110 and the drive circuit 150. The semiconductor packages 130-1 to 130-4 may include substrates 130-1A to 130-4A, respectively, and integrated circuits 140-1 to 140-4, respectively.

According to some embodiments, when each of the semiconductor packages 130-1 to 130-4 includes a chip-on-film (COF) package, each of the substrates 130-1A to 130-4A may include a base film.

According to some embodiments, when each of the semiconductor packages 130-1 to 130-4 includes a chip-on glass (COG) package, each of the substrates 130-1A to 130-4A may include a glass substrate. According to some embodiments, when each of the semiconductor packages 130-1 to 130-4 includes a chip-on flex package, each of the substrates 130-1A to 130-4A may include a flexible printed circuit (FPC) or a flexible printed circuit board (FPCB).

According to some embodiments, when each of the semiconductor packages 130-1 to 130-4 includes a chip-on-board package, each of the substrates 130-1A to 130-4A may include a chip-on-board substrate or a PCB. Each of the integrated circuits 140-1 to 140-4 may be, for example, a semiconductor chip and may include a display driver IC. According to some embodiments, when each of the semiconductor packages 130-1 to 130-4 includes a tape carrier package (TCP), each of the substrates 130-1A to 130-4A may include a printed circuit board (PCB), a FPC, or a FPCB.

As shown in FIG. 1A, the display panel 110 may be divided into, for example, four regions RG1 to RG4. When the display panel 110 is divided into the four regions RG1 to RG4, a first semiconductor package 130-1 may drive a first portion of an image, which will be displayed in a first region RG1 of the display panel 110. A second semiconductor package 130-2 may drive a second portion of the image, which will be displayed in a second region RG2 of the display panel 110. A third semiconductor package 130-3 may drive a third portion of the image, which will be displayed in a third region RG3 of the display panel 110. A fourth semiconductor package 130-4 may drive a fourth portion of the image, which will be displayed in a fourth region RG4 of the display panel 110. The present inventive concepts are illustrated in FIG. 1 having the display panel 110 divided into four regions RG1 to RG4 and having four semiconductor packages 130-1 to 130-4; however, the present inventive concepts are not limited thereto.

Figure 1B:
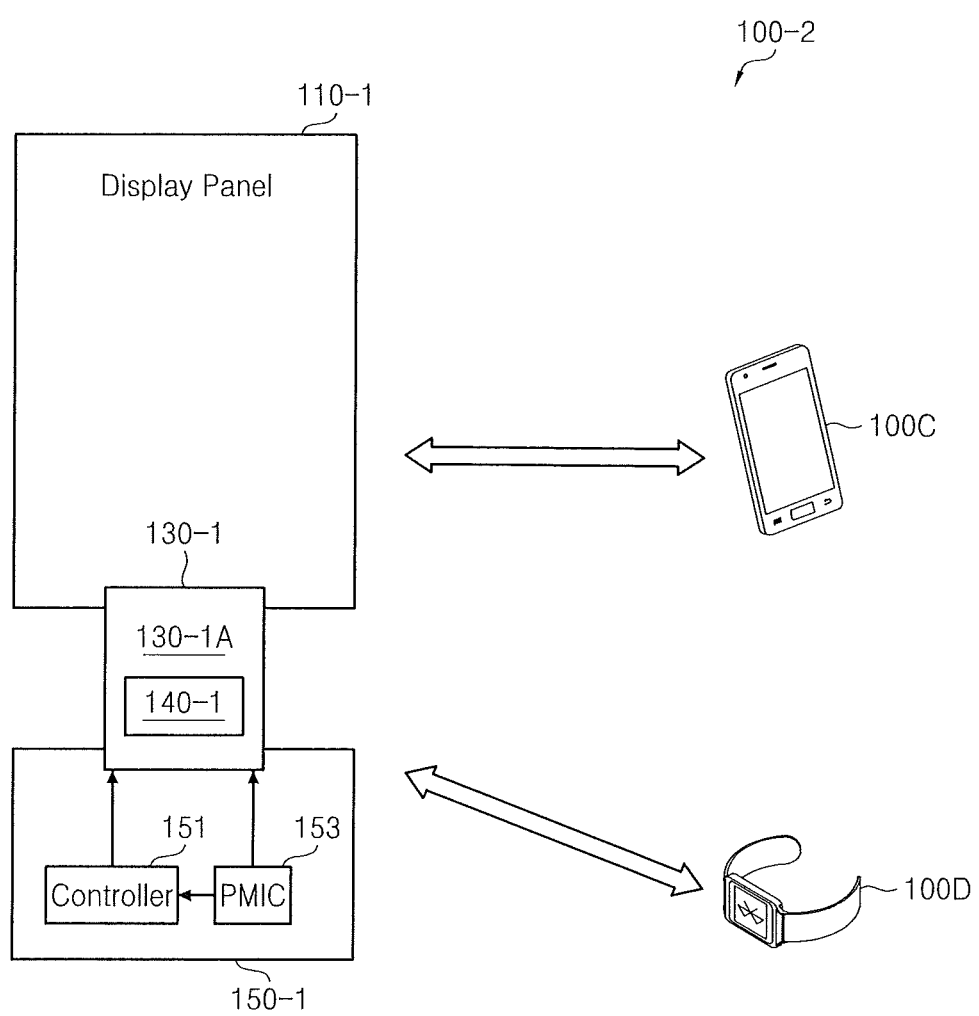
FIG. 1B is a block diagram illustrating a data processing system including semiconductor packages according to some embodiments of the present inventive concepts.

FIG. 1B is a block diagram illustrating a data processing system 100-2 including semiconductor packages according to some embodiments of the present inventive concepts. Referring to FIG. 1B, the data processing system 100-2 may include a display panel 110-1, a semiconductor package 130-1, and a drive circuit 150-1.

The drive circuit 150-1 may generate image data corresponding to an image to be displayed on the display panel 110-1 and may generate control signals necessary for transmission of the image data. The drive circuit 150-1 may collectively be, for example, a printed circuit board (PCB), an integrated circuit IC, a system on chip (SoC), an application processor, a mobile application processor, a chipset, a set of chips, or the like.

The drive circuit 150-1 may include the controller 151 and the PMIC 153. The controller 151 may include, for example, a CPU, a processor, or a timing controller. The controller 151 may generate image data corresponding to an image to be displayed on the display panel 110-1 and may generate control signals necessary for transmission of the image data generated by the controller 151. The PMIC 153 may transmit, or supply, an operating voltage and a ground voltage to the controller 151 and the semiconductor package 130-1.

The semiconductor package 130-1 may be electrically connected between the display panel 110-1 and the drive circuit 150-1. The semiconductor package 130-1 may include substrate 130-1A and integrated circuit 140-1.

According to some embodiments, when the semiconductor package 130-1 includes a chip-on-film (COF) package, the substrate 130-1A may include a base film.

According to some embodiments, when the semiconductor package 130-1 includes a chip-on glass (COG) package, the substrate 130-1A may include a glass substrate. According to some embodiments, when the semiconductor package 130-1 includes a chip-on flex package, the substrate 130-1A may include a flexible printed circuit (FPC) or a flexible printed circuit board (FPCB).

According to some embodiments, when the semiconductor package 130-1 includes a chip-on-board package, the substrate 130-1A may include a chip-on-board substrate or a PCB. The integrated circuit 140-1 may be, for example, a semiconductor chip and may include a display driver IC. According to some embodiments, when the semiconductor package 130-1 includes a tape carrier package (TCP), the substrate 130-1A may include a printed circuit board (PCB), a FPC, or a FPCB.

The data processing system 100-2 may include, for example, a mobile computing device. The mobile computing device 100-2 may include, for example, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, a drone, an e-book, or the like; however, the present inventive concepts are not limited thereto. A smart phone 100C and a wearable computer 100D, for example, a watch, are shown as example embodiments of the data processing system 100-2 in FIG. 1B.

The data processing system 100-2 may include two or more semiconductor packages connected between the display panel 110-1 and the drive circuit 150-1, which may include the semiconductor package 130-1 connected between the display panel 110-1 and the drive circuit 150-1.

According to some embodiments, the semiconductor package 130-1 may include, for example, a chip-on-film package, a chip-on-glass package, a chip-on-flex package, a chip-on-board package, or a TCP. The display panels 110 or 110-1 of FIGS. 1A and 1B, respectively, may perform a function of a touch display.

A display module may include the display panels 110 or 110-1 of FIGS. 1A and 1B, respectively, and one or more semiconductor packages.

Figure 2:
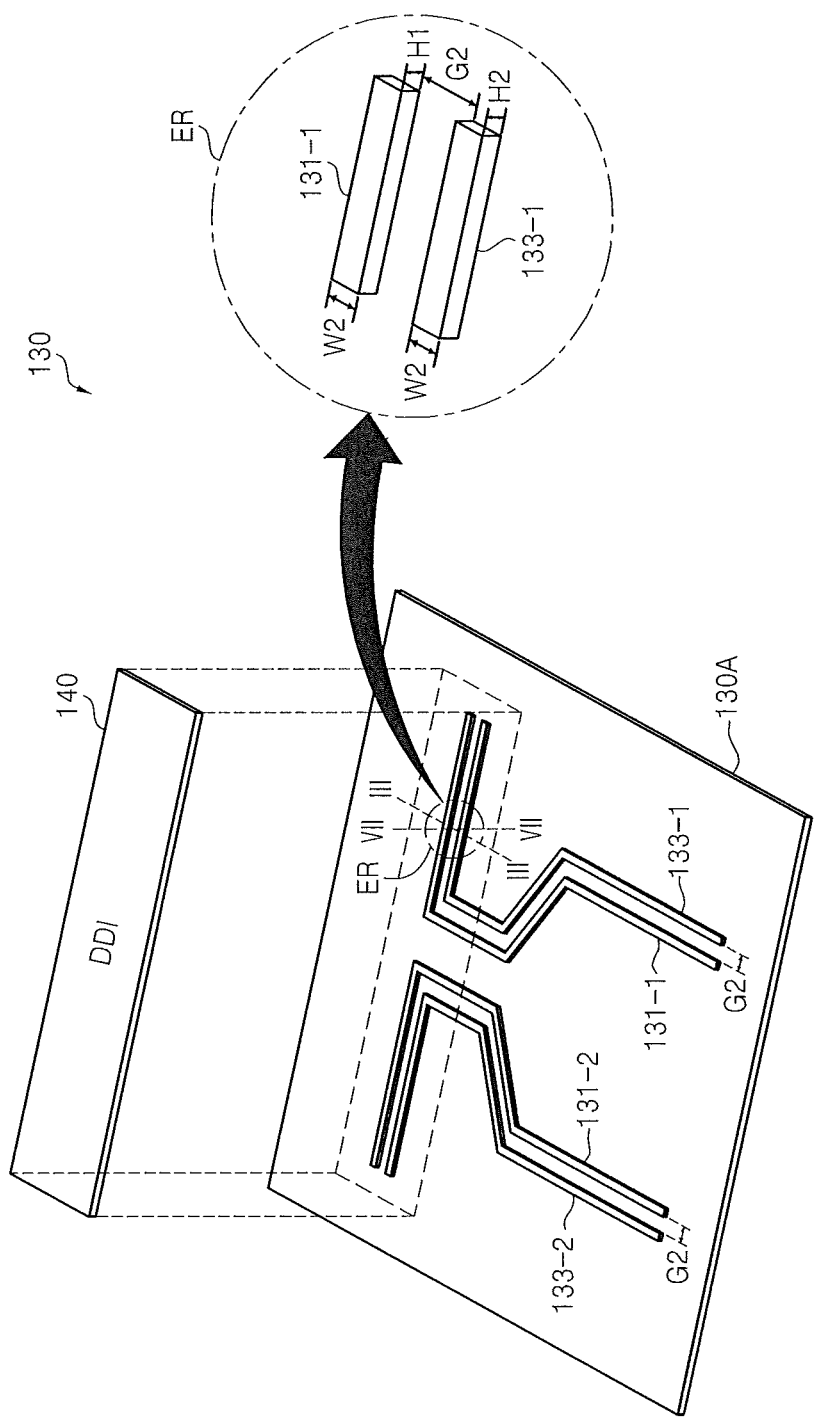
FIG. 2 is an exploded and enlarged view illustrating a semiconductor package including a power delivery network according to some embodiments of the present inventive concepts.

FIG. 2 is an exploded and enlarged view illustrating a semiconductor package including a power delivery network according to some embodiments of the present inventive concepts. FIG. 2 conceptually illustrates the semiconductor package including a power delivery network. Referring to FIGS. 1A, 1B and 2, a semiconductor package 130 may include, for example, a substrate 130A, a power delivery network, for example, power lines 131-1, 131-2, 133-1 and 133-2, and an integrated circuit 140. The semiconductor package 130 of FIG. 2 may be the semiconductor packages 130-1, 130-2, 130-3, or 130-4 of FIG. 1A or the semiconductor package 130-1 of FIG. 1B, the substrate 130A may be the substrates 130-1A, 130-2A, 130-3A, or 130-4A of FIG. 1A or the substrate 130-1A of FIG. 1B, and the integrated circuit 140 may be the integrated circuits 140-1, 140-2, 140-3, or 140-4 of FIG. 1A or the integrated circuit 140-1 of FIG. 1B.

The substrate 130A may include first connectors connected to the display panel 110 or 110-1 of FIGS. 1A and 1B, respectively, and second connectors connected to the drive circuit 150 or 150-1 of FIGS. 1A and 1B, respectively. For example, the integrated circuit 140 may be connected to the first connectors through first transmission lines and may be connected to the second connectors through second transmission lines, as described hereinafter. The second transmission lines may include a power delivery network.

The power delivery network may include at least one power line for transmitting the operating voltage VDD and at least one power line for transmitting the ground voltage VSS. The power line for transmitting the operating voltage VDD and the power line for transmitting the ground voltage VSS may be disposed to be in parallel with each other pair wise. For example, wirings of the power line for transmitting the operating voltage VDD and wirings of the power line for transmitting the ground voltage VSS may be disposed to be in parallel with each other at each point. For example, when each of power lines 131-1 and 131-2 for transmitting the operating voltage VDD is disposed or formed as illustrated in FIG. 2, each of power lines 133-1 and 133-2 for transmitting the ground voltage VSS may be disposed or formed along each of the power lines 131-1 and 131-2 in parallel with each of the power lines 131-1 and 131-2, respectively.

A power delivery network for transmitting the operating voltage VDD and the ground voltage VSS is illustrated in FIGS. 2 to 8 for convenience of description; however, in addition to the power delivery network of FIGS. 2 to 8, data transmission lines for transmitting image data output from the controller 151 and control signal transmission lines for transmitting control signals related to a transmission of the image data may be disposed or formed on or above the substrate 130A. Moreover, surface-mount devices (SMDs) may be disposed or formed on or above the substrate 130A.

Here, "on or above" includes both an embodiment in which a first material is disposed immediately on a second material and an embodiment in which the first material is disposed immediately on at least one of third materials disposed between the first material and the second material.

The integrated circuit 140 may be mounted or disposed on the substrate 130A. The integrated circuit 140 may include, for example, a display driver IC, and bumps formed in the integrated circuit 140 may be connected to the power deliver network for transmitting the operating voltage VDD and the ground voltage VSS.

The first power lines 131-1 and 131-2 for transmitting the operating voltage VDD supplied from the PMIC 153 to the integrated circuit 140 are disposed on or above the substrate 130A. The second power lines 133-1 and 133-2 for transmitting the ground voltage VSS supplied from the PMIC 153 to the integrated circuit 140 are disposed on or above the substrate 130A in parallel with the first power lines 131-1 and 131-2, respectively. The first pair of the first and second power lines 131-1 and 133-1 may be spaced apart from the second pair of the first and second power lines 131-2 and 133-2. The second pair of first and second power lines 131-2 and 133-2 may be a mirror image of the first pair of first and second power lines 131-1 and 133-1.

As illustrated in the enlarged view of first region ER, each of the first power lines 131-1 and the second power lines 133-1 has a first width W2. The first power line 131-1 is spaced apart from the second power line 133-1 by a first distance G2. A thickness H1 of the first power line 131-1 and a thickness H2 of the second power line 133-1 are less than or equal to 20 μm. A ratio W2/G2 of the first width W2 to the first distance G2 is greater than 2.5. For example, the first width W2 may be equal to or greater than 50 μm, the first distance G2 may be less than or equal to 20 μm (G2≤20 μm), and the thickness H1 of the power line 131-1 and the thickness H2 of second power line 133-1 may be greater than 0, and less than or equal to 20 μm.

In the same manner, each of the power line 131-2 and the power line 133-2 has the first width W2. The power line 131-2 is spaced apart from the power line 133-2 by the first distance G2. The thickness H1 of the first power line 131-2 and the thickness H2 of the second power line 133-2 are less than or equal to 20 μm. A ratio (W2/G2) of the first width W2 to the first distance G2 is greater than 2.5. G2/W2 is less than 0.4.

For example, the thickness H1 of the first power line 131-1 and the thickness H2 of the second power line 133-1 may be the same. However, the present inventive concepts are not limited thereto.

When a distance between the first and second power lines 131-1 and 133-1 and the first and second power lines 131-2 and 133-2 decreases, capacitance between the first and second power lines 131-1 and 133-1 and the first and second power lines 131-2 and 133-2 or parasitic components of the capacitance increases. For example, the first and second power lines 131-1 and 133-1 and the first and second power lines 131-2 and 133-2 may perform a function of plates of a capacitor. When a capacitance between the first and second power lines 131-1 and 133-1 and the first and second power lines 131-2 and 133-2 increases, a noise or a noise component which may be present between the first and second power lines 131-1 and 133-1 and the first and second power lines 131-2 and 133-2 may be suppressed.

When the first width W2 of each of the power lines first and second 131-1, 131-2, 133-1 and 133-2 increases, inductance related to each of the first and second power lines 131-1, 131-2, 133-1, and 133-2 or a parasitic component of the inductance decreases. Thereby a magnetic noise or a magnetic noise component which may occur in each of the first and second power lines 131-1, 131-2, 133-1, and 133-2 may be suppressed.

Accordingly, in order that the ratio (W2/G2) of the first width W2 to the first distance G2 is made to be greater than 2.5 and a ratio (G2/W2) of the first distance G2 to the first width W2 is made to be less than 0.4 in some embodiments according to the present inventive concepts, the first width W2 needs to be increased and, at the same time, the first distance G2 needs to be decreased. The first distance G2 may be, for example, a gap. According to such a design, capacitance between corresponding power lines increases, and, at the same time, inductance of each of the power lines is reduced.

In FIG. 2, each of the first power lines 131-1 and 131-2 for transmitting each operating voltage VDD to the integrated circuit 140 is disposed inside each of the second power lines 133-1 and 133-2, respectively, for transmitting each ground voltage VSS to the integrated circuit 140 in FIG. 2; however, the present inventive concepts are not limited thereto. The first power lines 131-1 and 131-2 and the second power lines 133-1 and 133-2 may be disposed in an opposite manner.

The first power lines 131-1 and 131-2 and the second power lines 133-1 and 133-2 may be disposed on or above the substrate 130A to reduce EMI.

That is, as the first distance G2 is decreased, capacitive parasitic components between each of the first power lines 131-1 and 131-2 for transmitting the operating voltage VDD and each of the second power lines 133-1 and 133-2 for transmitting the ground voltage VSS are increased (or maximized), and, thereby, noises which may be present between the first and second power lines 131-1 and 133-1 and the first and second power lines 131-2 and 133-2 may be suppressed.

Moreover, as the widths W2 of each of the first power lines 131-1 and 131-2, and each of the second power lines 133-1 and 133-2 are increased, inductive parasitic components between the first and second power lines 131-1 and 133-1 and the first and second power lines 131-2 and 133-2 are reduced (or minimized), and, thereby, noises present between the first and second power lines 131-1 and 133-1 and the first and second power lines 131-2 and 133-2 may be suppressed. As a result, a radiated electromagnetic field may be suppressed, thereby, reducing EMI.

The substrate 130A may be, for example, a base film, when the semiconductor package 130 is a chip-on-film package, the substrate 130A may be, for example, a glass substrate, when the semiconductor package 130 is a chip-on-glass package, and the substrate 130A may be, for example, a flexible printed circuit board, when the semiconductor package 130 is a chip-on-flex package.

Figure 3:
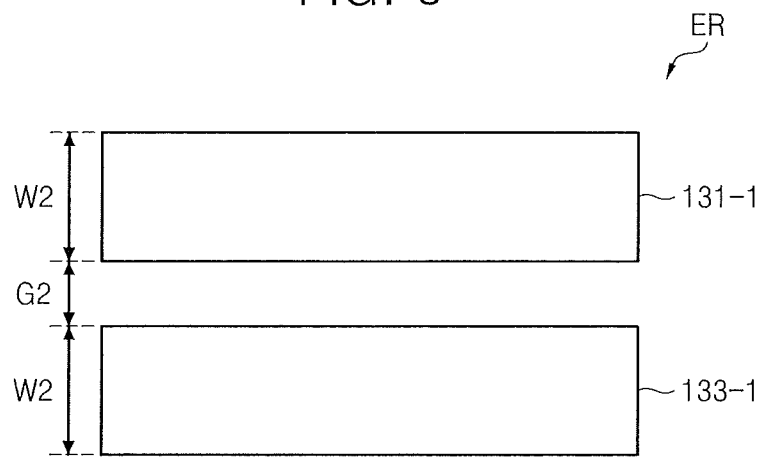
FIG. 3 is an enlarged, plan view of a first region of the power delivery network of FIG. 2 according to some embodiments of the present inventive concepts.

FIG. 3 is an enlarged, plan view of a first region ER of the power delivery network illustrated in FIG. 2. Referring to a plan view of a first region ER of FIG. 3 taken along line III-III of FIG. 2, each of the first power line 131-1 for transmitting the operating voltage VDD from the PMIC 153 to the integrated circuit 140 and the second power line 133-1 for transmitting the ground voltage VSS from the PMIC 153 to the integrated circuit 140 has the first width W2 and a distance between the first power line 131-1 and the second power line 133-1 is the first distance G2.

Figure 4:
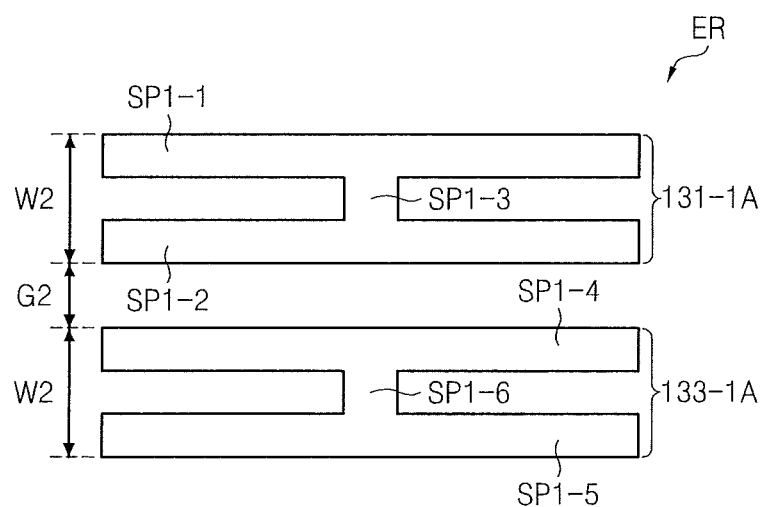
FIG. 4 is an enlarged, plan view of the first region of the power delivery network of FIG. 2 according to some embodiments of the present inventive concepts.

FIG. 4 is the enlarged, plan view of the first region ER of the power delivery network illustrated in FIG. 2. Referring to the plan view of the first region ER of FIG. 5 taken along line of FIG. 2, a first power line 131-1A for transmitting the operating voltage VDD includes first sub-power lines SP1-1 and SP1-2, and a second power line 133-1A for transmitting the ground voltage VSS includes second sub-power lines SP1-4 and SP1-5.

The first sub-power lines SP1-1 and SP1-2 are connected to each other by at least one of first conductors SP1-3. That is, the first sub-power lines SP1-1 and SP1-2 may be connected to each other by a plurality of first conductors SP1-3. The second sub-power lines SP1-4 and SP1-5 are connected to each other by at least one of second conductors SP1-6. That is, the second sub-power lines SP1-4 and SP1-5 may be connected to each other by a plurality of second conductors SP1-6. Each of the first sub-power lines SP1-1 and SP1-2 and each of the second sub-power lines SP1-4 and SP1-5 may be, for example, formed of the same metal material as each of conductors SP1-3 and SP1-6 on or above the substrate 130A at the same time.

A distance between the first power line 131-1A and the second power line 133-1A is the first distance G2. That is, first sub-power line SP1-2 is spaced apart from the second sub-power line SP1-4 by the first distance G2.

Figure 5:
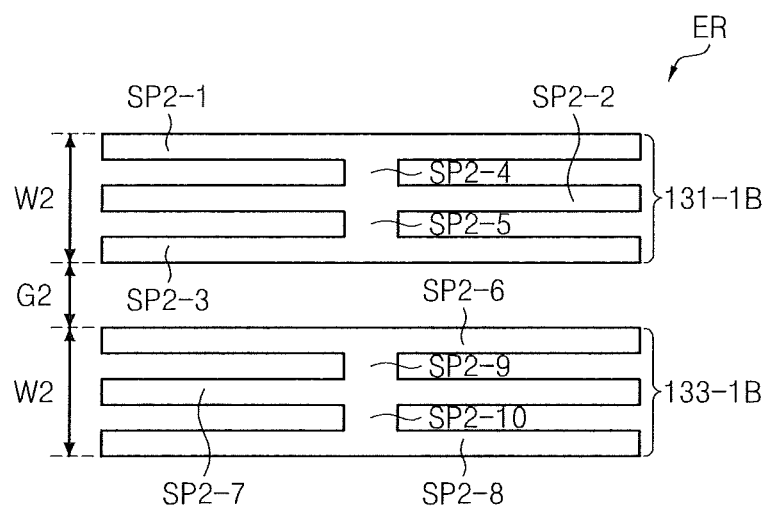
FIG. 5 is an enlarged, plan view of the first region of the power delivery network of FIG. 2 according to some embodiments of the present inventive concepts.

FIG. 5 is an enlarged, plan view of the first region ER of the power delivery network illustrated in FIG. 2. Referring to the plan view of the first region ER of FIG. 5 taken along line of FIG. 2, a first power line 131-1B for transmitting the operating voltage VDD from the PMIC 153 to the integrated circuit 140 includes first sub-power lines SP2-1 to SP2-3, and a second power line 133-1B for transmitting the ground voltage VSS from the PMIC 153 to the integrated circuit 140 includes second sub-power lines SP2-6 to SP2-8. The first sub-power lines SP2-1 to SP2-3 are connected to each other by first conductors SP2-4 and SP2-5, and the second sub-power lines SP2-6 to SP2-8 are connected to each other by second conductors SP2-9 and SP2-10. Each of the first sub-power lines SP2-1 to SP2-3 and each of the second sub-power lines SP2-6 to SP2-8 may be formed of the same metal material as each of the conductors SP2-4, SP2-5, SP2-9, and SP2-10 on or above the substrate 130A at the same time.

A distance between the first power line 131-1B and the second power line 133-1B is the first distance G2. That is, first sub-power line SP2-3 is spaced apart from the second sub-power line SP2-6 by the first distance G2.

Figure 6:
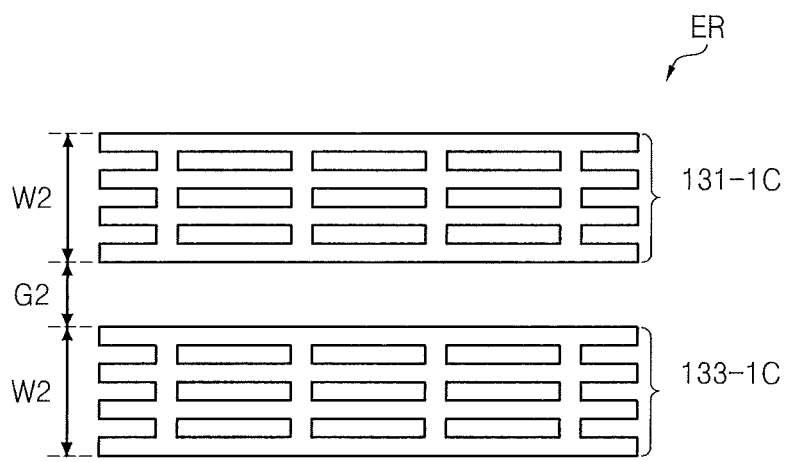
FIG. 6 is an enlarged, plan view of the first region of the power delivery network of FIG. 2 according to some embodiments of the present inventive concepts.

FIG. 6 is an enlarged, plan view of the first region ER of the power delivery network shown in FIG. 2. Referring to a plan view of a first region ER of FIG. 6 taken along line of FIG. 2, each of a first power line 131-1C for transmitting the operating voltage VDD from the PMIC 153 to the integrated circuit 140 and a second power line 133-1C for transmitting the ground voltage VSS from the PMIC 153 to the integrated circuit 140 may include a mesh shape. That is, each of the first and second power lines 131-1C and 133-1C may include a plurality of sub-power lines, each connected to each other by a plurality of conductors.

A distance between the first power line 131-1C and the second power line 133-1C is the first distance G2.

Figure 7:
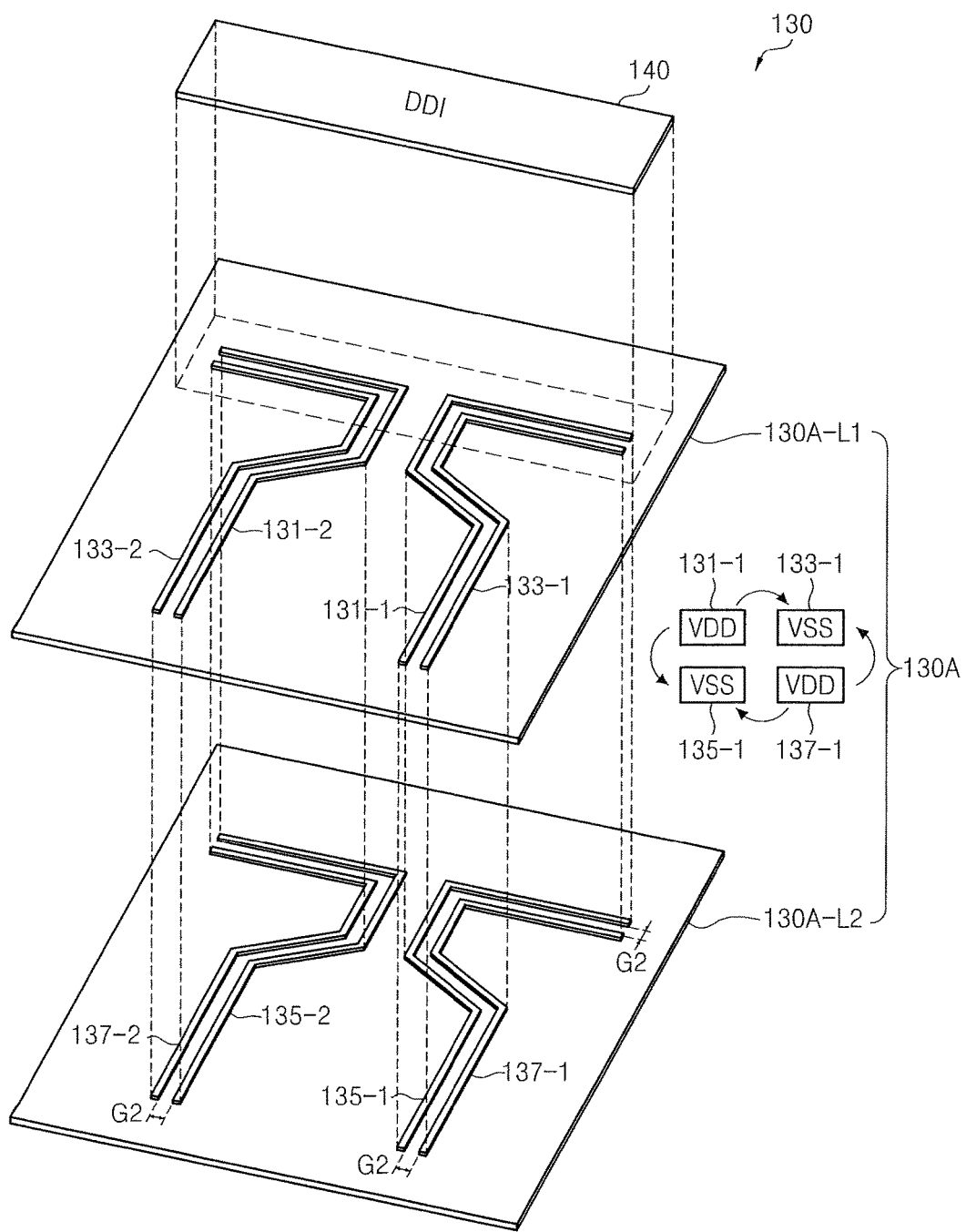
FIG. 7 is an exploded, conceptual and perspective view illustrating a semiconductor package including the power delivery network and a substrate having a multi-layer structure according to some embodiments of the present inventive concepts.

FIG. 7 is an exploded, conceptual and perspective view illustrating a semiconductor package including the power delivery network and a substrate having a multi-layer structure according to some embodiments of the present inventive concepts. FIG. 7 conceptually shows the semiconductor package including the power delivery network and a substrate having a multi-layer structure. Referring to FIGS. 1A, 1B, 2, and 7, the substrate 130A taken along line VII-VII of FIG. 2 includes a first layer 130A-L1 and a second layer 130A-L2 separated from each other by an insulating material.

The first power lines 131-1 and 131-2 and the second power lines 133-1 and 133-2 are disposed on or above the first layer 130A-L1, as described in connection with substrate 130A of FIG. 2.

The second layer 130A-L2 includes a third power lines 135-1 and 135-2 and a fourth power lines 137-1 and 137-2. The third power line 135-1 is disposed on or above the second layer 130A-L2 to be vertically overlapped with the first power line 131-1 for transmitting the operating voltage VDD and transmits the ground voltage VSS to the integrated circuit 140.

The fourth power line 137-1 is disposed on or above the second layer 130A-L2 to be vertically overlapped with the second power line 133-1 for transmitting the ground voltage VSS and transmits the operating voltage VDD to the integrated circuit 140. Each of the third power line 135-1 and the fourth power line 137-1 has the first width W2. The third power line 135-1 is spaced apart from the fourth power line 137-1 by the first distance G2. A thickness of the third power line 135-1 and a thickness of the fourth power line 137-1 are less than or equal to 20 μm. A ratio (W2/G2) of the first width W2 to the first distance G2 is greater than 2.5.

The third power line 135-2 is disposed on or above the second layer 130A-L2 to be vertically overlapped with the first power line 131-2 for transmitting the operating voltage VDD and transmits the ground voltage VSS to the integrated circuit 140.

The fourth power line 137-2 is disposed on or above the second layer 130A-L2 to be vertically overlapped with the second power line 133-2 for transmitting the ground voltage VSS and transmits the operating voltage VDD to the integrated circuit 140. Each of the third and fourth power lines 135-2 and 137-2 has the first width W2. The third power line 135-2 is spaced apart from the fourth power line 137-2 by the first distance G2. A thickness of the third power line 135-2 and a thickness of the fourth power line 137-2 are, for example, less than or equal to 20 μm. A ratio (W2/G2) of the first width W2 to the first distance G2 is greater than 2.5.

EMI generated from each of the power lines 131-1, 137-1, 131-2, and 137-2 for transmitting the operating voltage VDD may be reduced by a power delivery network having a structure as illustrated in FIG. 7.

Figure 8:
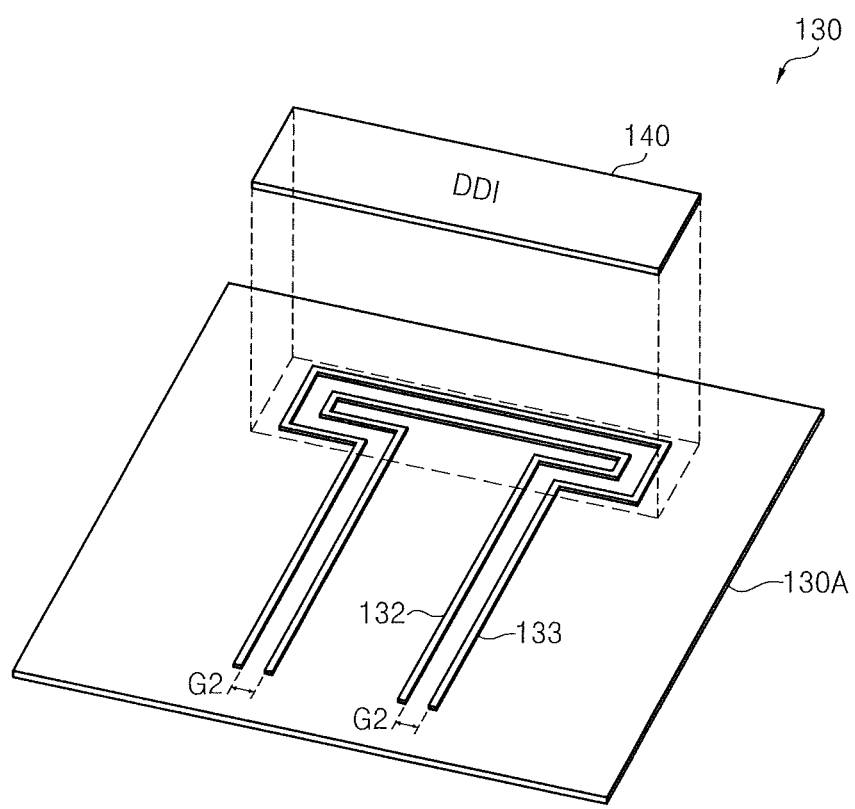
FIG. 8 is an exploded, perspective view illustrating the semiconductor package including the power delivery network having an open loop shape according to some embodiments of the present inventive concepts.

FIG. 8 is an exploded, perspective view illustrating a semiconductor package including a power delivery network according to some embodiments of the present inventive concepts, which has an open loop shape. Referring to FIGS. 1A, 1B, 2, and 8, each of a first power line 132 for transmitting the operating voltage VDD from the PMIC 153 to the integrated circuit 140 and a second power line 133 for transmitting the ground voltage VSS from the PMIC 153 to the integrated circuit 140 has an open loop shape as shown in FIG. 8. For example, the second power line 133 is disposed outside the first power line 132 in FIG. 8; however, the present inventive concepts are not limited thereto. The second power line 133 and the first power line 132 may be disposed in an opposite manner.

Figure 9:
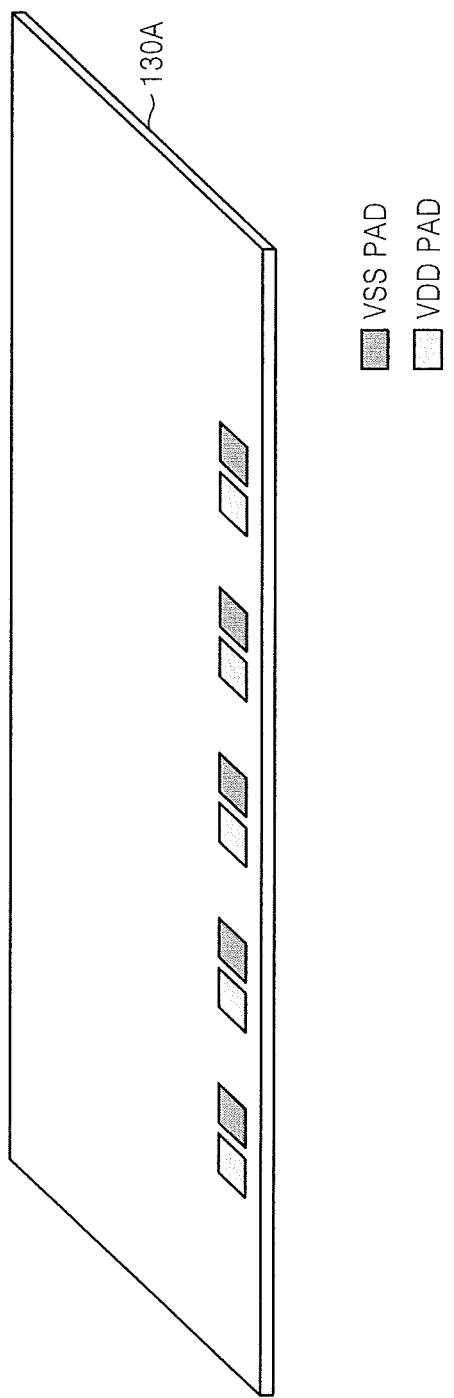
FIG. 9 is a perspective view illustrating a layout of pads arranged on a substrate according to some embodiments of the present inventive concepts.

FIG. 9 is a layout view of pads arranged on a substrate according to some embodiments of the present inventive concepts. FIGS. 2 to 8 conceptually illustrate example embodiments for a layout of the power lines for transmitting the operating voltage VDD and the power lines for transmitting the ground voltage VSS.

As illustrated in FIG. 9, a plurality of pads, including a plurality of ground voltage pads VSS PAD and a plurality of operating voltage pads VDD PAD, may be disposed on the substrate 130A. The substrate may be, for example, a chip on film (CoF) including a single layer.

A first group of operating voltage pads VDD PAD is related to a transmission of the operating voltage VDD and a second group of ground voltage pads VSS PAD is related to a transmission of the ground voltage VSS. Each of the pads VSS PAD and VDD PAD may be connected to each of the power line for transmitting the operating voltage VDD and the power line for transmitting the ground voltage VSS.

Figure 10:
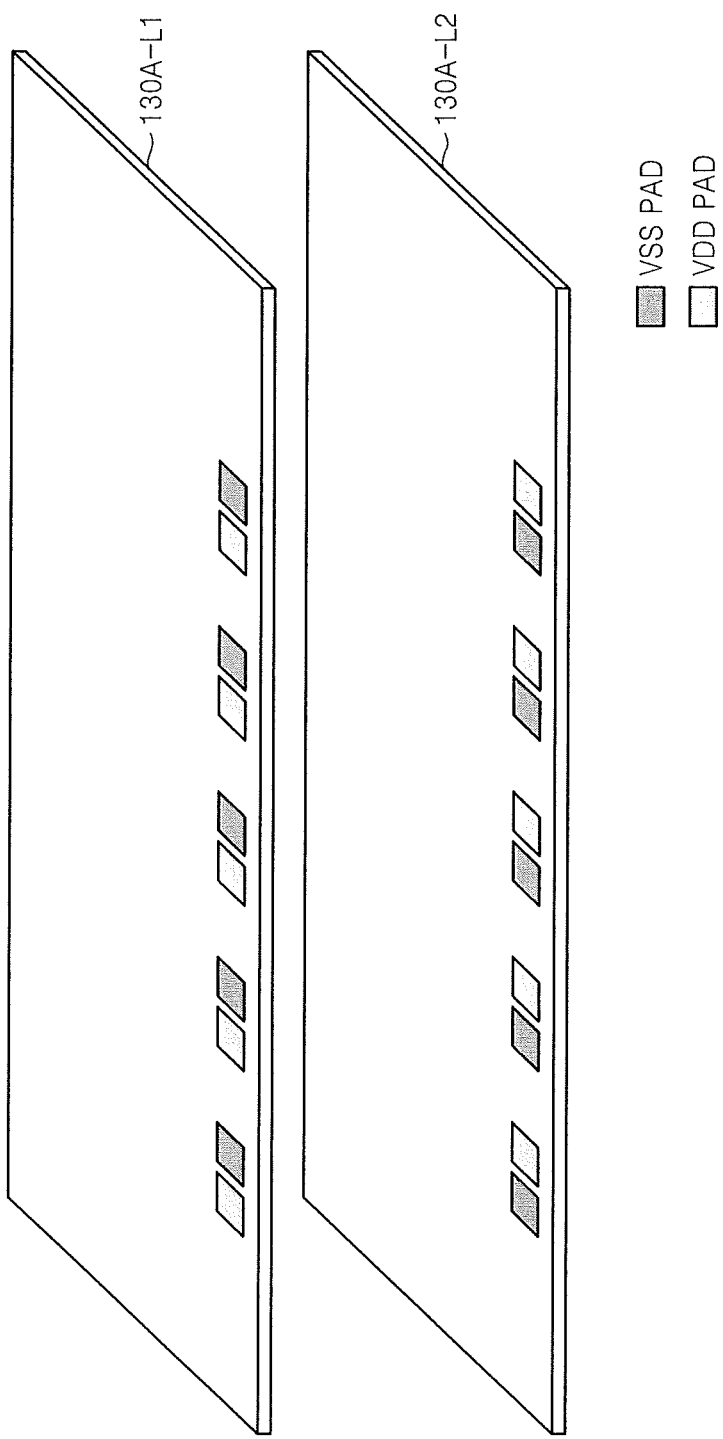
FIG. 10 is a perspective view illustrating a layout of the pads arranged on a substrate according to some embodiments of the present inventive concepts.

FIG. 10 is a layout view of the pads arranged on a substrate according to some embodiments of the present inventive concepts. FIG. 7 conceptually illustrates example embodiments for a layout of the power lines for transmitting the operating voltage VDD and the power lines for transmitting the ground voltage VSS.

The plurality of pads, including ground voltage pads VSS PAD and operating voltage pads VDD PAD, may be disposed on each of layers 130A-L1 and 130-L2 of FIG. 7. A substrate may include multi-layers; however, a substrate including two layers 130A-L1 and 130A-L2 is shown in FIG. 10 as an example. The substrate may be, for example, a CoF including multi-layers.

The first to fourth power lines 131-1, 131-2, 133-1, 133-2, 135-1, 135-2, 137-1, and 137-2 shown in FIG. 7 are disposed in a structure of concentrating electromagnetic fields possibly radiated to the inside and offsetting electromagnetic fields outside the first to fourth power lines 131-1, 131-2, 133-1, 133-2, 135-1, 135-2, 137-1, and 137-2. The ground voltage pads VSS PAD and the operating voltage pads VDD PAD connected to the first to fourth power lines 131-1, 131-2, 133-1, 133-2, 135-1, 135-2, 137-1, and 137-2, respectively, are alternately disposed in a horizontal direction and a vertical direction. For example, the ground voltage pads VSS PAD connected to the power lines for transmitting the ground voltage VS S are disposed in a vicinity of the operating voltage pads VDD PAD connected to the power line for transmitting the operating voltage VDD.

A substrate according to some embodiments of the present inventive concepts reduces inductive parasitic components and increases capacitance parasitic components by setting a width of a first power line for transmitting an operating voltage and a width of a second power line for transmitting a ground voltage as a first width and setting a distance between the first power line and the second power line as a first distance, thereby reducing EMI.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A display device comprising:
   a display panel configured to display an image;
   a drive circuit configured to drive the display panel; and
   a semiconductor package connected between the display panel and the drive circuit,
   wherein the semiconductor package includes:
   a substrate including a first layer and a second layer separated by an insulating material;
   an integrated circuit on the substrate;
   a first power line on or above the first layer and configured to transmit an operating voltage to the integrated circuit;
   a second power line on or above the first layer and configured to transmit a ground voltage to the integrated circuit;
   a third power line on or above the second layer to be vertically overlapped with the first power line and configured to transmit the ground voltage to the integrated circuit; and
   a fourth power line on or above the second layer to be vertically overlapped with the second power line and configured to transmit the operating voltage to the integrated circuit,
   wherein each of the first power line, the second power line, the third power line and the fourth power line has a first width in a first direction, the first width of the first power line being the same as the first width of the second power line,
   wherein the first power line is spaced apart from the second power line by a first distance in the first direction, and the third power line is spaced apart from the fourth power line by the first distance in the first direction,
   wherein thicknesses in a second direction substantially perpendicular to the first direction of each of the first power line, the second power line, the third power line and the fourth power line are less than or equal to 20 μm, and
   wherein the first width in the first direction is greater than the first distance in the first direction.

2. The display device of claim 1, wherein, when the semiconductor package is a chip-on film package, the substrate is a base film, and
   wherein the integrated circuit is a display driver IC configured to control the display panel using signals output from the drive circuit.

3. The display device of claim 1, wherein, when the semiconductor package is a chip-on glass package, the substrate is a glass substrate, and
   wherein the integrated circuit is a display driver IC configured to control the display panel using signals output from the drive circuit.

4. The display device of claim 1, wherein, when the semiconductor package is a chip-on flex package, the substrate is a flexible printed circuit substrate, and
   wherein the integrated circuit is a display driver IC configured to control the display panel using signals output from the drive circuit.

5. The display device of claim 1, wherein the first power line includes first sub-power lines,
   the second power line includes second sub-power lines,
   the first sub-power lines are connected to each other by at least one first conductor, and
   the second sub-power lines are connected to each other by at least one second conductor.

6. The display device of claim 1, wherein each of the first power line, the second power line, the third power line and the fourth power line is in a mesh shape.

7. The display device of claim 1, wherein each of the first power line, the second power line, the third power line and the fourth power line is in an open loop shape.

8. The display device of claim 1, wherein the drive circuit includes:
   a processor generating data related to the image and control signals configured to control the integrated circuit; and
   a power management IC generating the operating voltage and the ground voltage, and
   wherein the drive circuit is a system on chip.

9. A semiconductor package comprising:
   a substrate including a first layer and a second layer separated by an insulating material;
   an integrated circuit on the substrate;
   a first power line on or above the first layer and configured to transmit an operating voltage to the integrated circuit;
   a second power line on or above the first layer and configured to transmit a ground voltage to the integrated circuit;
   a third power line on or above the second layer to be vertically overlapped with the first power line and configured to transmit the ground voltage to the integrated circuit; and
   a fourth power line on or above the second layer to be vertically overlapped with the second power line and configured to transmit the operating voltage to the integrated circuit,
   wherein each of the first power line, the second power line, the third power line and the fourth power line has a first width in a first direction, the first width of the first power line being the same as the first width of the second power line,
   wherein the second power line has a first end having the first width and a second end having the first width,
   wherein the first power line is spaced apart from the second power line by a first distance in the first direction, and the third power line is spaced apart from the fourth power line by the first distance in the first direction,
   wherein thicknesses in a second direction substantially perpendicular to the first direction of each of the first power line, the second power line, the third power line and the fourth power line are less than or equal to 20 μm, and
   wherein the first width in the first direction is greater than the first distance in the first direction.

10. The semiconductor package of claim 9, wherein, when the semiconductor package is a chip-on-film package, the substrate is a base film, and wherein the integrated circuit is a display driver IC.

11. The semiconductor package of claim 9, wherein, when the semiconductor package is a chip-on-glass package, the substrate is a glass substrate, and wherein the integrated circuit is a display driver IC.

12. The semiconductor package of claim 9, wherein the first power line includes first sub-power lines, the second power line includes second sub-power lines, the first sub-power lines are connected to each other by at least one first conductor, and the second sub-power lines are connected to each other by at least one second conductor.

13. The semiconductor package of claim 9, wherein each of the first power line, the second power line, the third power line and the fourth power line is in a mesh shape.

14. The semiconductor package of claim 9, wherein each of the first power line, the second power line, the third power line and the fourth power line is in an open loop shape.

15. A substrate used for a semiconductor package including a display driver IC, the substrate comprising:

a first layer;

a second layer separated from the first layer by an insulating material;

a first power line on or above the first layer and configured to transmit an operating voltage to the display driver IC;

a second power line on or above the first layer and configured to transmit a ground voltage to the display driver IC;

a third power line on or above the second layer to be vertically overlapped with the first power line and configured to transmit the ground voltage to the integrated circuit; and a fourth power line on or above the second layer to be vertically overlapped with the second power line and configured to transmit the operating voltage to the integrated circuit, wherein each of the first power line, the second power line, the third power line and the fourth power line has a first width in a first direction, the first width of the first power line being the same as the first width of the second power line, wherein the first power line is spaced apart from the second power line by a first distance in the first direction, and the third power line is spaced apart from the fourth power line by the first distance in the first direction, wherein thicknesses in a second direction substantially perpendicular to the first direction of each of the first power line, the second power line, the third power line and the fourth power line are less than or equal to 20 μm, wherein the first width in the first direction is greater than the first distance in the first direction, wherein the substrate is a base film, when the semiconductor package is a chip-on-film package, wherein the substrate is a glass substrate, when the semiconductor package is a chip-on-glass package, and wherein the substrate is a flexible printed circuit board, when the semiconductor package is a chip-on-flex package.

16. The substrate of claim 15, wherein each of the first power line, the second power line, the third power line and the fourth power line is in a mesh shape.

17. The substrate of claim 15, wherein each of the first power line, the second power line, the third power line and the fourth power line is in an open loop shape.

\* \* \* \* \*